(12) United States Patent
Wimpenny

(10) Patent No.: US 9,350,302 B2
(45) Date of Patent: May 24, 2016

(54) REDUCED BANDWITH OF SIGNAL IN AN ENVELOPE PATH FOR ENVELOPE TRACKING SYSTEM

(71) Applicant: SNAPTRACK, INC., San Diego, CA (US)

(72) Inventor: Gerard Wimpenny, Cambourne (GB)

(73) Assignee: SNAPTRACK, INC., San Diego, CA (US)

(*) Notice: Subject to any disclaimer, the term of this patent is extended or adjusted under 35 U.S.C. 154(b) by 58 days.

(21) Appl. No.: 14/519,258

(22) Filed: Oct. 21, 2014

(65) Prior Publication Data
US 2015/0123735 A1 May 7, 2015

(30) Foreign Application Priority Data
Oct. 21, 2013 (GB) .................................. 1318524.4

(51) Int. Cl.
| | |
|---|---|
| H03G 3/20 | (2006.01) |
| H03F 3/04 | (2006.01) |
| H03F 1/30 | (2006.01) |
| H03F 1/02 | (2006.01) |
| H03F 1/32 | (2006.01) |
| H03F 3/00 | (2006.01) |
| H03F 3/189 | (2006.01) |
| H03F 3/24 | (2006.01) |
| H03F 3/21 | (2006.01) |

(52) U.S. Cl.
CPC ............... *H03F 1/30* (2013.01); *H03F 1/0227* (2013.01); *H03F 1/3241* (2013.01); *H03F 3/005* (2013.01); *H03F 3/189* (2013.01); *H03F 3/21* (2013.01); *H03F 3/211* (2013.01); *H03F 3/245* (2013.01); *H03F 2200/102* (2013.01); *H03F 2200/111* (2013.01); *H03F 2201/3206* (2013.01); *H03F 2203/21181* (2013.01); *H03F 2203/21184* (2013.01); *H03F 2203/21193* (2013.01)

(58) Field of Classification Search
USPC ......................................... 330/136, 127, 297
IPC ..................................... H03G 3/20; H03F 3/04
See application file for complete search history.

(56) References Cited

U.S. PATENT DOCUMENTS

| | | | |
|---|---|---|---|
| 5,778,307 A | 7/1998 | Budnik | |
| 5,886,572 A * | 3/1999 | Myers | ................... H03F 1/0222 330/10 |
| 6,822,523 B2 | 11/2004 | Grosspietsch et al. | |
| 7,120,579 B1 | 10/2006 | Licht | |

(Continued)

FOREIGN PATENT DOCUMENTS

| | | |
|---|---|---|
| GB | 2488380 A | 8/2012 |
| GB | 2500705 A | 10/2013 |
| WO | 2006123349 A1 | 11/2006 |
| WO | 2007034500 A1 | 3/2007 |
| WO | 2013136860 A1 | 9/2013 |

OTHER PUBLICATIONS

Officer: Susanne Wingenfeld, "International Search Report and Written Opinion", dated Jan. 21, 2015, issued in counterpart international application No. PCT/EP2014/072447.

(Continued)

*Primary Examiner* — Patricia T Nguyen

(57) ABSTRACT

An envelope tracking power amplifier system comprising an RF input path and an envelope path for providing a modulated power amplifier supply, further comprising a plurality of envelope detectors for detecting the envelope of a plurality of frequency bands of an input signal and each generating an output signal, and a combiner for combining the output of the envelope detectors.

20 Claims, 8 Drawing Sheets

(56) References Cited

U.S. PATENT DOCUMENTS

| | | | |
|---|---|---|---|
| 9,065,509 B1* | 6/2015 | Yan | H04B 1/0475 |
| 2001/0000456 A1 | 4/2001 | McGowan | |
| 2009/0015295 A1* | 1/2009 | Aoki | H03D 1/18 327/58 |
| 2009/0140804 A1 | 6/2009 | Plotnik et al. | |
| 2012/0281597 A1 | 11/2012 | Khlat et al. | |
| 2014/0084995 A1* | 3/2014 | Hadji-Abdolhamid | H03F 3/245 327/543 |
| 2014/0085007 A1* | 3/2014 | Hadji-Abdolhamid | H03F 3/19 330/297 |
| 2014/0118066 A1* | 5/2014 | Lee | H03F 3/24 330/149 |

OTHER PUBLICATIONS

Albert Cesari et al, "A DSP structure authorizing reduced-bandwidth DC/DC Converters for Dynamic Supply of RF Power Amplifiers in Wideband Applications", 2006, pp. 3361-3366, vol. 1-4244-0136-4/06, Publisher: IEEE, Published in: France.

Jinseong Jeong et al, "Wideband Envelope Tracking Power Amplifier with Reduced Bandwidth Power Supply Waveform", 2009, pp. 1381-1384, vol. 978-1-4244-2804-5/09, Publisher: IEEE, Published in: CA/USA.

"Parent Application No. GB 13185244", "Office Action", Apr. 11, 2014, Publisher: GB IPO, Published in: GB.

* cited by examiner

REDUCED BANDWITH OF SIGNAL IN AN ENVELOPE PATH FOR ENVELOPE TRACKING SYSTEM

CROSS-REFERENCE TO RELATED APPLICATION(S)

Great Britain Patent Application No. 1318524.4, with a filing date of Oct. 21, 2013, is incorporated herein by reference.

FIELD OF THE INVENTION

The present invention relates to envelope tracking systems having an RF input path to a signal input of a power amplifier and an envelope path to a supply input of a power amplifier. Such envelope tracking systems may be utilised in cellular systems or WiFi systems for example.

BACKGROUND TO THE INVENTION

Envelope tracking power amplifier systems are known in the art, and generally comprise the provision of an input signal to be amplified on an RF input path to a signal input of a power amplifier, and an envelope path for generating a modulated power supply based on the input signal, with the modulated power supply being provided to a power supply input of the power amplifier.

An exemplary prior art envelope tracking power amplifier system is illustrated in FIG. 1(a). A signal to be amplified, in this example being a complex signal having I and Q components, is generated by a source block 108. The signal to be amplified is provided to a delay block 106 which provides a delay alignment. The output of the delay block 106 provides a signal to the RF input path and a signal to the envelope path. The signal in the RF input path is provided to an RF up-conversion block 104 which converts the input signal to an RF signal, and then provides the input to a power amplifier 102. The envelope path receives the signal from the delay block 106 in an envelope detector block 114, which detects the envelope of this signal. The thus detected envelope is provided to an envelope shaping block 112 which shapes the envelope, and the output of the envelope shaping block 112 is delivered to a supply modulator 110. The output of the supply modulator 110 provides the modulated supply voltage to a supply terminal of the power amplifier 102. The output of the power amplifier 102 provides an RF output signal.

The delay block 106 provides delay adjustment to maintain precise timing alignment between the RF signal in the input path applied to the input of the power amplifier 102 and the modulated power supply voltage applied to the supply terminal of the power amplifier 102.

The envelope shaping block 112 comprises a shaping table and implements an envelope shaping function, and may be provided in order to remove signal troughs from the signal in the envelope path.

RF linearisation of the circuit of FIG. 1(a) may be achieved by adjusting the envelope shaping function of the envelope shaping block 112.

FIG. 1(b) represents an alternative implementation of a prior art envelope tracking power amplifier system. The system of FIG. 1(b) corresponds to the system of FIG. 1(a), and like reference numerals are used to illustrate similar elements. FIG. 1(b) but additionally includes a DPD (digital pre-distortion) block 116 positioned between the output signal of the delay block 106 and the input of the RF up-conversion block 104. The DPD block 116 provides pre-distortion of the RF waveform and acts in addition to or alternatively to the envelope shaping function 112, to achieve RF linearization of the system. In this implementation the pre-distortion of the complex signal occurs after the point at which the envelope is detected.

FIG. 1(c) illustrates a further modification to the arrangement of FIG. 1(a) for a prior art envelope tracking power amplifier system. The system of FIG. 1(c) corresponds to the system of FIG. 1(a), and like reference numerals are used to illustrate similar elements. In FIG. 1(c) a DPD block 118 is connected between the output of the source block 108 and the input to the delay block 106. Thus pre-distortion is applied before the point at which the envelope is detected. This pre-distortion function provided by the DPD block 118, either alternatively to or additional to the envelope shaping block 112, achieves RF linearization of the system.

Prior art envelope tracking systems maintain a 1:1 relationship between the instantaneous supply voltage applied to the power amplifier and the instantaneous envelope of the RF input signal applied to the power amplifier. That is, for each value of the envelope of the RF input there is one corresponding value of supply voltage. As a result of this 1:1 relationship, a DPD block needs only to be one-dimensional and receive only a signal representing the signal input to the power amplifier. The operation of the non-linear envelope detection operation provided by the envelope detector block 114 increases the bandwidth of the signal in the envelope path. In a typical implementation the supply modulator bandwidth, i.e. the bandwidth in the envelope path, is chosen to be 1.5 to 3 times the bandwidth of the RF path.

The maximum bandwidth an envelope tracking system can support is typically determined by the design of the supply modulator 110. In particular the maximum current and voltage signal slew rate the supply modulator can support without introducing significant distortion typically determines the maximum bandwidth of the envelope tracking system.

The maximum RF bandwidth required for the RF input path of most current cellular systems is 20 MHz, but it is expected that this will rise to 40 MHz or higher in future systems.

Future WiFi systems such as 802.11ac will be required to support an RF (radio frequency) bandwidth in the input path of up to 160 MHz.

The design of a supply modulator having a bandwidth of greater than 40 MHz is extremely challenging using existing semiconductor technology. Furthermore, the sub-nanosecond timing alignment accuracy which is required to be controlled by the delay block 106 for these higher bandwidth systems becomes increasingly difficult to achieve and maintain.

The bandwidth of the supply modulator and the RF to envelope delay matching requirements can be significantly reduced by using partial envelope tracking. This requires a reduced bandwidth supply reference signal to be generated in the envelope path, subject to the constraint that the instantaneous voltage of the supply reference signal must be greater than the instantaneous voltage of the full bandwidth RF envelope signal at all times in order to provide sufficient supply voltage to amplify the input signal in the power amplifier 102.

This can be illustrated with reference to FIG. 2.

FIG. 2 illustrates a plot of voltage supply against time for an envelope signal having a reduced bandwidth and for an envelope signal having a full (normal) bandwidth. Reference numeral 202 identifies the supply voltage for a reduced bandwidth envelope signal, and reference numeral 204 illustrates the supply voltage for a full bandwidth envelope signal.

Without the constraint that the voltage of the supply reference signal must be greater than the voltage of the full bandwidth RF envelope at all times, the supply voltage may in fact be lower than the amplitude of the RF envelope at certain times. This constraint is not met if a simple low pass filter is introduced in the envelope path. It then is not possible to linearise the RF signal using RF pre-distortion due to excessive power amplifier compression.

With such a system, applying this constraint, there is no longer a 1:1 mapping between the instantaneous RF envelope signal and the instantaneous supply voltage, so it is not possible to correct system non-linearity using simple one dimensional DPD blocks as shown in FIGS. 1(b) and (c) (element 116 of FIG. 1(b) and element 118 of FIG. 1(c)).

In the prior art there are disclosed methods for generating reduced bandwidth envelopes. Reference can be made to IEEE IMS2009 paper J. Jeong et al. "Wideband Envelope Tracking Power Amplifier with Reduced Bandwidth Power Supply Waveform" and A. Cesari et al. "A DSP Structure authorising Reduced-Bandwidth DC/DC converters for Dynamic Supply of RF Amplifiers in Wideband Applications" Proc. Industrial Electronics Conf. November 2006.

It is an aim of the present invention to provide an improved envelope tracking power amplifier system in which the bandwidth in the envelope path is reduced.

SUMMARY OF THE INVENTION

The invention provides an envelope tracking power amplifier system comprising an RF path and an envelope path, the envelope path comprising: a plurality of envelope detectors for detecting the envelope of a plurality of contiguous frequency bands of an input signal and each generating an output signal; and a combiner for combining the output of the envelope detectors.

The envelope path may further comprise a corresponding plurality of filters each adapted to receive the input signal and for generating inputs to the envelope detectors of a specific frequency band.

Each envelope detector may be adapted to receive an input signal of a specific frequency band.

The input signal may provide an input to an RF amplifier, and further comprising envelope processing circuitry for providing an input to a modulator providing a modulated power supply to the RF amplifier based on the combined output of the envelope detectors. The envelope processing circuitry may include an envelope shaping block.

The envelope tracking power supply may further comprise a digital pre-distortion block arranged to receive a signal representative of a power amplifier input and a signal representative of the power amplifier supply voltage. The digital pre-distortion block may be provided in the input path. The digital pre-distortion block may provide an input to the power amplifier.

The envelope tracking power supply may further comprise a delay block for aligning the power amplifier supply voltage and the power amplifier input voltage. The delay block applies a delay to the signal in the input path.

The invention also provides an envelope tracking power amplifier system comprising an RF input path and an envelope path for providing a modulated power amplifier supply, further comprising: a plurality of envelope detectors for detecting the envelope of a plurality of frequency bands of an input signal and each generating an output signal; a combiner for combining the output of the envelope detectors to provide a composite envelope signal; and a digital pre-distortion block arranged to receive a signal representative of a power amplifier input and a signal representative of the power amplifier supply voltage.

The digital pre-distortion block may be provided in the input path. The digital pre-distortion block may provide an input to the power amplifier.

The envelope tracking power amplifier may further comprise envelope processing circuitry for providing an input to a modulator providing a modulated power supply to the RF amplifier based on the composite envelope signal. The envelope processing circuitry may include an envelope shaping block. The digital pre-distortion block may receive a shaped composite envelope signal and the input signal.

The envelope tracking power amplifier may further comprise: a plurality of input paths each for receiving an input signal of a particular frequency; and a combiner for combining the signals on the inputs paths and for providing the combined input signals to the digital pre-distortion block.

The envelope tracking power supply may further comprise a delay block for aligning the power amplifier supply voltage and the power amplifier input voltage. The delay block may apply a delay to the signal in the input path.

The envelope tracking power amplifier may further comprise: a plurality of input paths each for receiving an input signal of a particular frequency; a plurality of digital pre-distortion blocks arranged to receive a signal representative of a power amplifier input in the respective input path and the signal representative of the power amplifier supply voltage; and a plurality of power amplifiers each for receiving an input signal in the respective input path; wherein the power supply for each of the plurality of power amplifiers is provided in dependence on the composite envelope signal.

The envelope tracking power supply may further comprise a delay block in each of the plurality of input paths for aligning the power amplifier supply voltage and the respective power amplifier input voltage in each input path.

The invention further provides an envelope tracking power amplifier comprising: a plurality of envelope detectors for detecting the envelope of a plurality of frequency bands of an input signal and each generating an output signal; a combiner for combining the output of the envelope detectors to provide a composite envelope signal; and a plurality of input paths each for receiving an input signal of a particular frequency; a plurality of digital pre-distortion blocks arranged to receive a signal representative of a power amplifier input in the respective input path and the signal representative of the power amplifier supply voltage; and a plurality of power amplifiers each for receiving an input signal in the respective input path; wherein the power supply for each of the plurality of power amplifiers is provided in dependence on the composite envelope signal.

The invention further provides a method adapted to perform the functions of any defined apparatus.

BRIEF DESCRIPTION OF THE FIGURES

The present invention is now described by way of example with reference to the Figures, in which.

DETAILED DESCRIPTION

The present invention is now described by way of reference to preferred examples and preferred implementations. However one skilled in the art will appreciate that the present invention is not limited to its application to the specific examples as set out hereinbelow.

It is possible to correct for the non-linearity resulting from the envelope path bandwidth reduction by using a two-dimensional DPD block, which applies pre-distortion which depends on both the instantaneous RF envelope of the RF input signal and the instantaneous supply voltage. A two-dimensional DPD block receives a signal representing the instantaneous supply input to the power amplifier and a signal representing the signal input to the power amplifier.

Figure 1A:
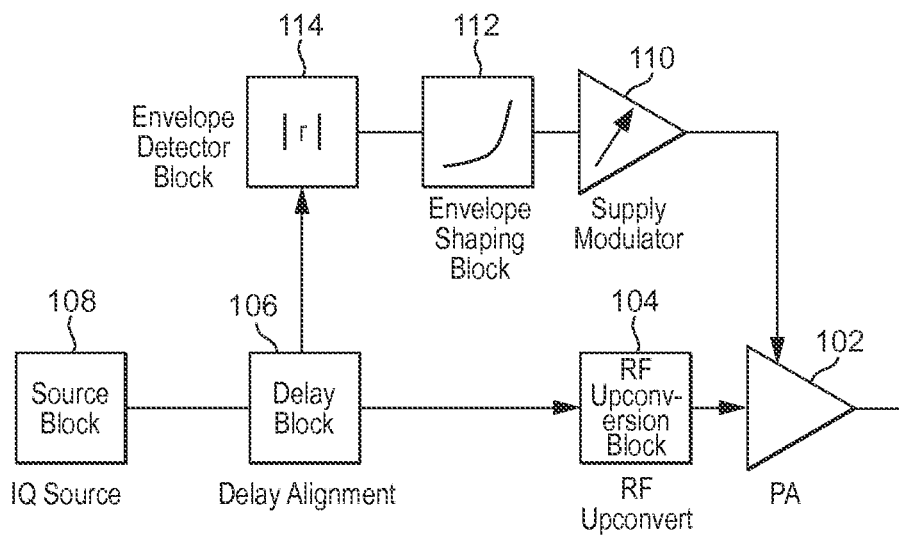
FIGS. 1(a) to 1(c) illustrate prior art implementations of an envelope tracking power amplifier system for achieving RF linearisation.
Figure 1B:
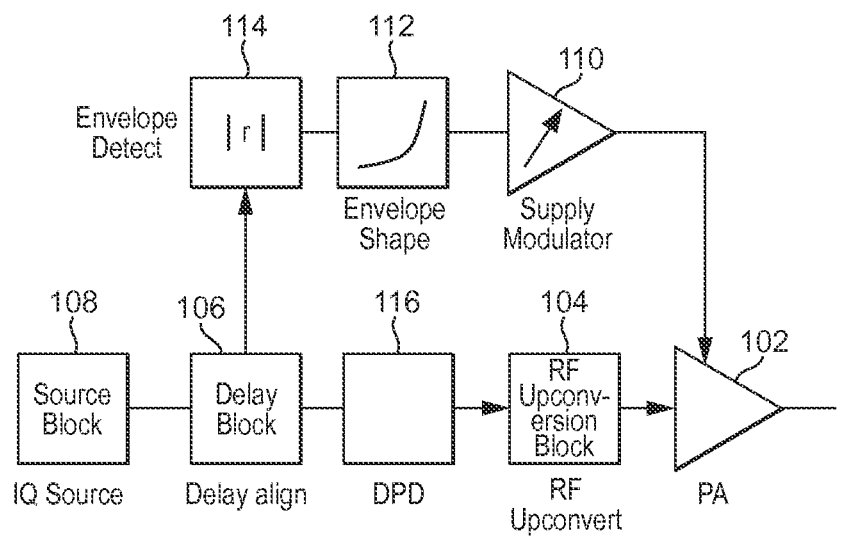
Figure 1C:
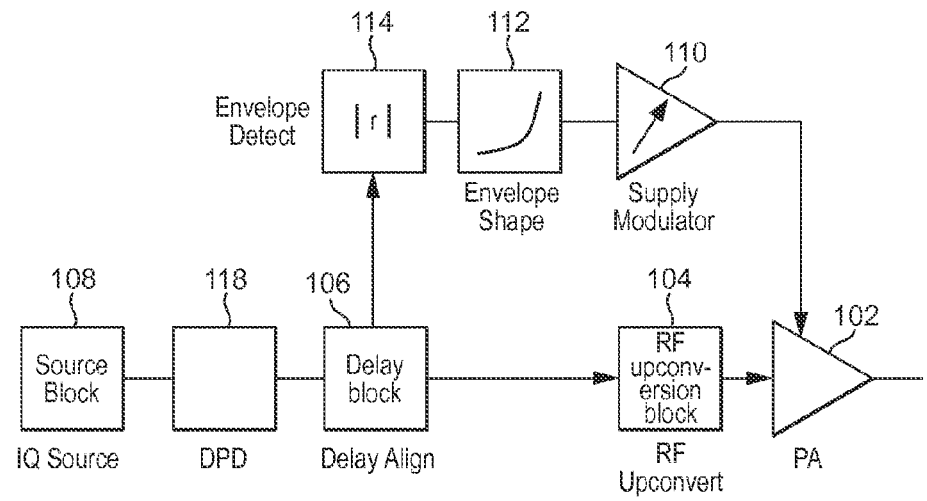
Figure 3:
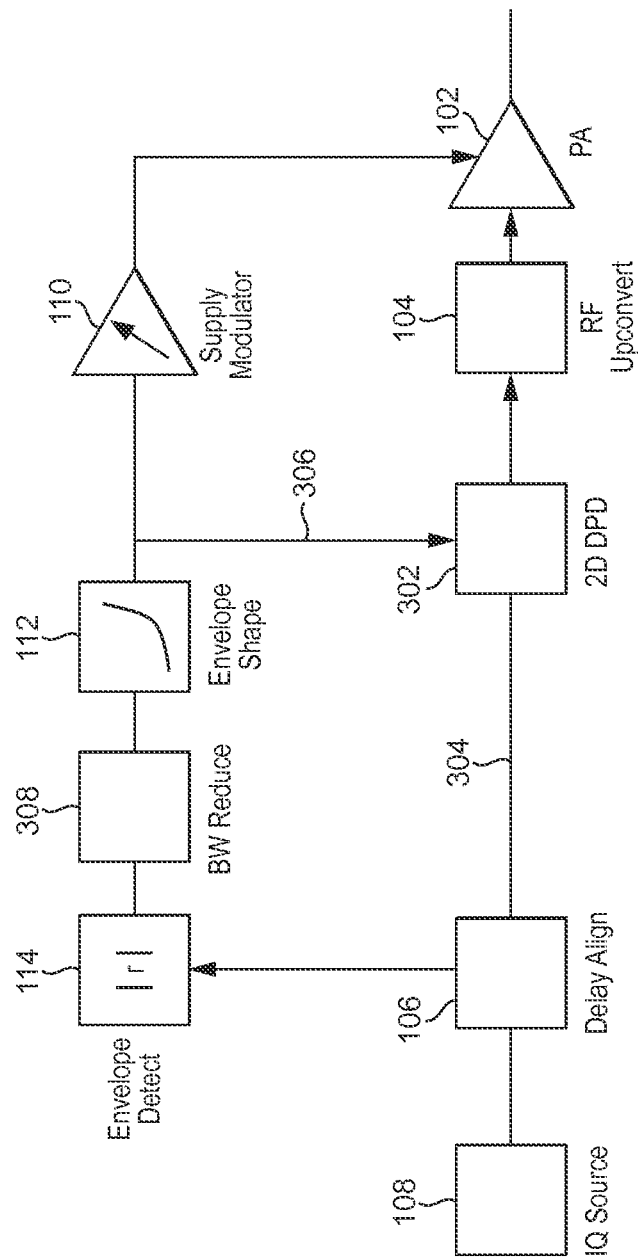
FIG. 3 illustrates an implementation of an envelope tracking power amplifier system having a reduced envelope bandwidth and a two-dimensional DPD element to achieve RF linearisation.

An implementation of an envelope tracking power amplifier system incorporating a two-dimensional DPD block is illustrated in FIG. 3. In the system of FIG. 3 like reference numerals are used to identify similar elements to earlier figures. As illustrated in FIG. 3, a two-dimensional DPD block is identified by reference numeral 302, and is located between the output of the delay block 106 and the input to the RF up-conversion block 104. The two-dimensional DPD block in this arrangement has two inputs (referring to its two dimensions), so that in addition to receiving the output of the delay block 106 on a line 304 (as in FIG. 1(a)), the DPD block additionally receives as a second input the output of the envelope shaping block 112 on a line 306.

Additionally illustrated in FIG. 3 is a block 308 which applies a bandwidth reduction in the envelope path in accordance with prior art techniques, which is connected between the output of the envelope detector 114 and the input of the envelope shaping table 112.

Figure 4A:
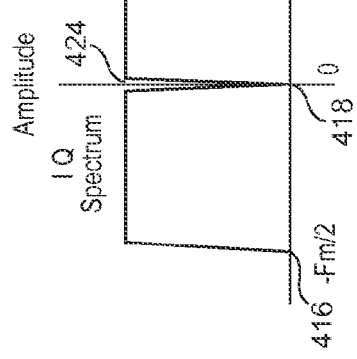
FIGS. 4(a) to 4(d) illustrate the principle of generating sub-band signals in accordance with arrangements.

With reference to FIG. 4(a), there is illustrated a plot of amplitude against frequency for a complex baseband IQ signal which forms an input signal and is to be amplified by the power amplifier. This signal has a bandwidth of Fm.

FIG. 4(a) illustrates a plot of amplitude against frequency for the spectrum of input IQ signal. As illustrated in FIG. 4(a), the signal has a frequency spectrum deviation which extends from –Fm/2 to Fm/2 as denoted by reference numerals 402 and 404 respectively. The spectrum of a given signal will be symmetrical about zero Hz. The spectrum has an amplitude denoted by reference numeral 406 in FIG. 4(a).

Figure 4B:
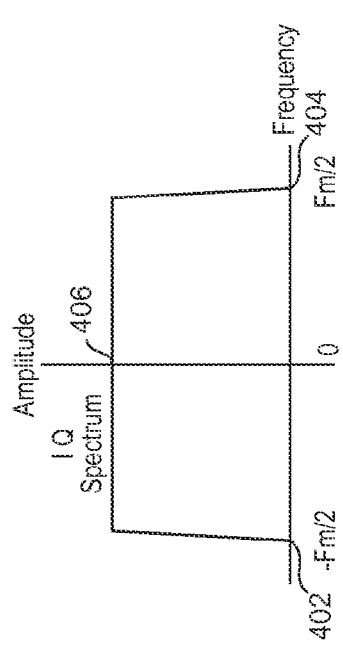

FIG. 4(b) illustrates a plot of amplitude against frequency for the spectrum of the reference signal in the envelope path resulting from such an input signal spectrum. This is the spectrum of the signal of FIG. 4(a) after envelope detection. As can be seen, the mathematical operation of the envelope detector results in a signal of a larger bandwidth. As can be seen in FIG. 4(b) this signal has a bandwidth which extends to a point on the frequency axis denoted by reference numeral 412, which is well in excess of the frequency Fm denoted by reference numeral 410. The bandwidth of this signal extends from a point 408 representing a zero frequency to the point 412, which is in excess of the frequency Fm denoted by point 410. As illustrated in FIG. 4(b), this signal has an amplitude of value denoted by reference numeral 414 until the frequency Fm, and then after frequency Fm the amplitude of this signal drops significantly until it gradually approaches zero at the frequency denoted by reference numeral 412.

Thus, as shown in FIG. 4(b), the bandwidth (>>Fm) of the envelope signal as shown in FIG. 4(b) is greater than the bandwidth (Fm) of the input signal as shown in FIG. 4(a).

The baseband signal can be considered to be made up of n sub-bands, where n≥2. For the purposes of explanation it is assumed that n=2. Baseband representations of each of the sub-band signals can then be calculated as illustrated in FIG. 4(c).

Figure 4C:
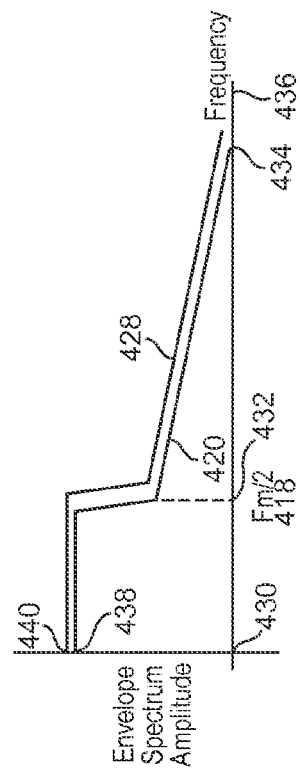

With reference to FIG. 4(c), there is illustrated the frequency spectrum of two sub-bands of the baseband complex IQ signal. Each spectrum signal has an amplitude as denoted by reference numeral 424. A first sub-band has a spectrum which extends from a frequency –Fm/2 as denoted by reference numeral 416 to zero as denoted by reference numeral 418. A second sub-band has a band with which it extends from frequency zero as denoted by reference numeral 418 to a frequency Fm/2 as denoted by reference numeral 420.

Figure 4D:
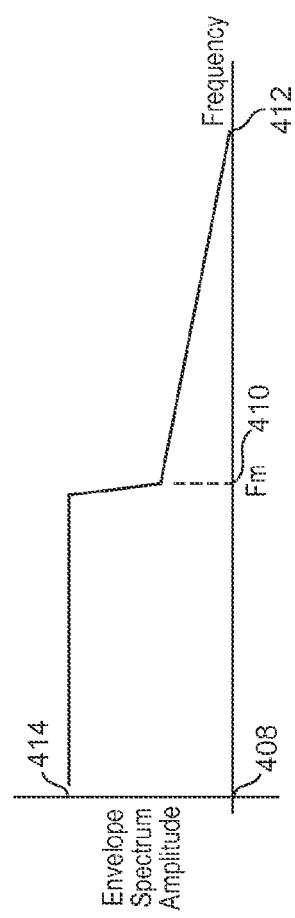

FIG. 4(b) illustrates the envelope spectrum of the signals associated with these two sub-bands in the envelope path after they are applied to the envelope detector. As denoted in FIG. 4(d), each sub-band has its own spectrum. It can be assumed that the spectrum denoted by plot 420 corresponds to the first sub-band and the spectrum denoted by plot 428 corresponds to the second sub-band.

The respective sub-bands 420 and 428 have respective amplitudes denoted by reference numerals 438 and 440 at a zero frequency denoted by reference numeral 430, which amplitude generally extends to the frequency Fm/2 denoted by reference numeral 432. In practice the amplitudes denoted by reference numerals 438 and 440 will be the same, and they are shown at different levels in FIG. 4(d) for illustration purposes. At the frequency Fm/2 denoted by reference numeral 432 the amplitude of the respective spectrum significantly drops, such that the amplitude then decreases gradually towards zero, the amplitude of the spectrum denoted by plot 420 approaching an amplitude of zero as denoted by reference numeral 434 on the frequency axis, and the amplitude of plot 428 approaching zero as represented by the reference numeral 436 on the frequency axis.

As can be seen, the envelope spectrum of each of the sub-bands overlay one another. The envelope spectrum of each of the sub-band signals is independent of its carrier frequency.

The bandwidth of the sub-band envelope spectrums are 1/n of the bandwidth of the full bandwidth of the envelope signal, in this case Fm/2. This can be seen in FIG. 4(d).

Figure 2:
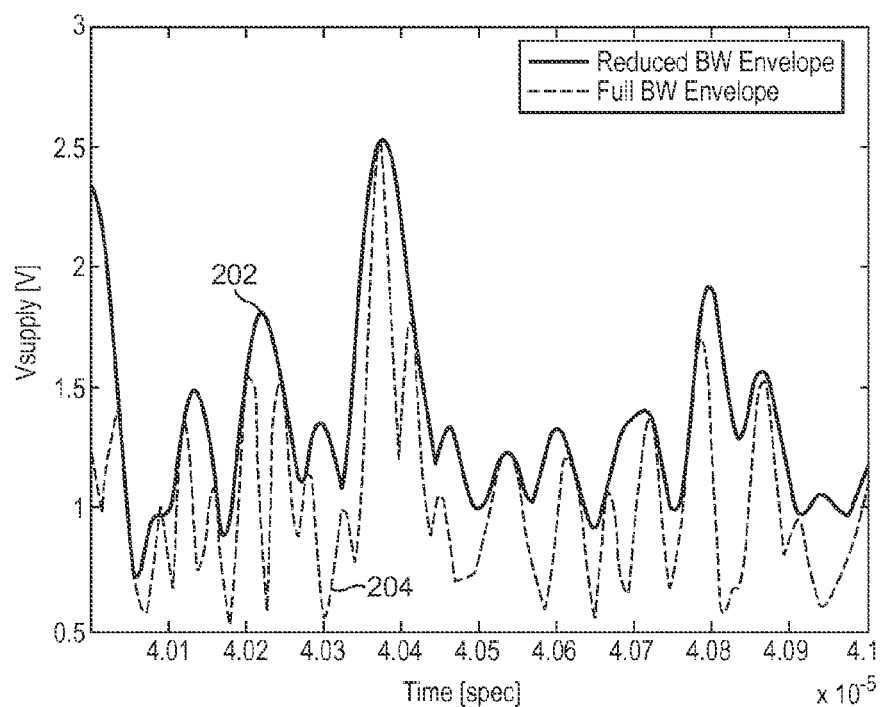
FIG. 2 illustrates the waveforms of a modulated supply voltage for a reduced envelope path bandwidth and for a full envelope path bandwidth.

A reduced bandwidth reference signal can be calculated as the sum of the individual sub-band envelope signals. This signal has the same bandwidth as each of the sub-band envelopes, and furthermore meets the essential criteria that the reduced bandwidth envelope signal always has an amplitude greater than the full bandwidth envelope signal: adding together the spectra of the two sub-bands if FIG. 4(d), for example, gives an amplitude of the amplitude 433 plus the amplitude 440, which will exceed the amplitude 424. This is shown in FIG. 2, in which the amplitude of the reduced bandwidth envelope 202 is always greater than the amplitude of the full bandwidth envelope 204.

Figure 5A:
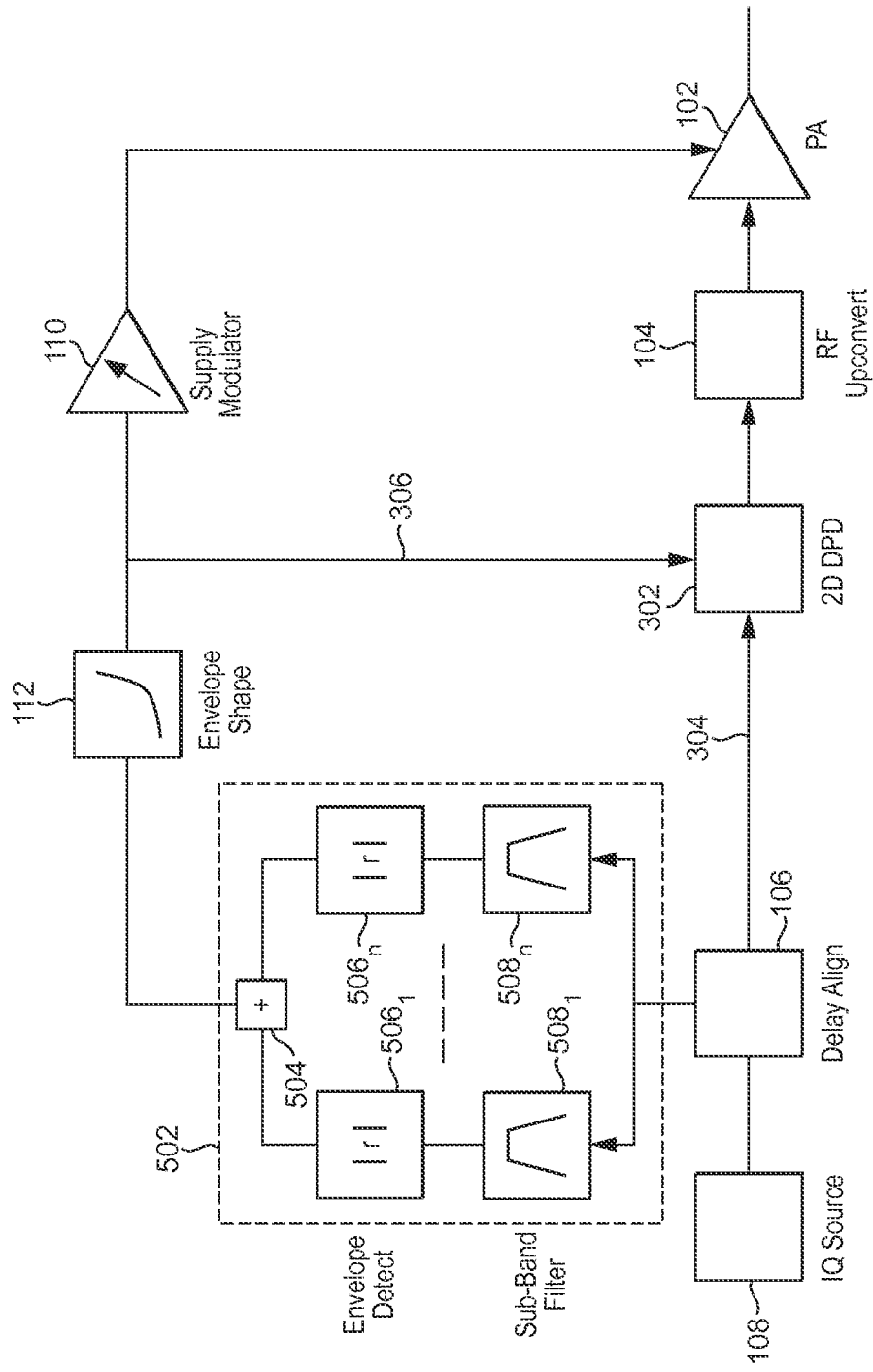
FIGS. 5(a) and 5(b) illustrate the implementation of circuitry in the envelope path to reduce the bandwidth of the envelope signal in accordance with arrangements in which a source signal is divided into sub-bands.

An example implementation of an envelope tracking power amplifier in accordance with these principles is illustrated in FIG. 5(a). Like reference numerals are used to illustrate components which correspond to components of earlier figures.

As can be seen in FIG. 5(a) the envelope detection block 114 of FIG. 3 is replaced by an envelope detection block 502. The envelope detection block 502 comprises a plurality of sub-band filters which will correspond to the number of sub-bands the baseband signal is being divided up into. In the example of FIG. 5(a) it is assumed that the baseband signal is being divided into n sub-bands, and thus a first sub-band filter $508_1$ and a $n^{th}$ sub-band filter $508_n$ are illustrated. It will be apparent that the number of sub-band filters corresponds to the number of sub-bands. The plurality of envelope detectors detect the envelope of a plurality of contiguous frequency bands of the input signal.

The output of each sub-band filter provides an input to an envelope detection block. Thus the output of sub-band filter $508_1$ provides an input to an envelope detection block $506_1$, and the output of sub-band filter $508_n$ provides an input to an envelope detection block $506_n$. It will be apparent that the number of envelope detection blocks corresponds to the number of sub-band filters, and in turn corresponds to the number of sub-bands the baseband signal is divided into.

The output of each envelope detection block, in the example of FIG. 5(a) the output of envelope detection blocks $506_1$ to $506_n$, are combined in a combiner 504 which generates at its output the combined outputs of the envelope detection blocks.

The combined output of the output of the combiner 504 is provided as an input to the envelope shaping function 112.

OFDM is a modulation method favoured for many current and future communication systems, on account of its high spectral efficiency and multi-path immunity. OFDM comprises a large number (denoted N) of narrow sub-carriers, each of which is modulated at a relatively slow rate. N is typically chosen to be a power of 2, to allow efficient computation of the modulation using inverse fast Fourier transforms (FFTs).

If n is also chosen to be a power of 2 (typically 2 or 4) then the sub-band envelopes can be efficiently calculated by sharing hardware already required to calculate the full bandwidth signal.

Figure 5B:
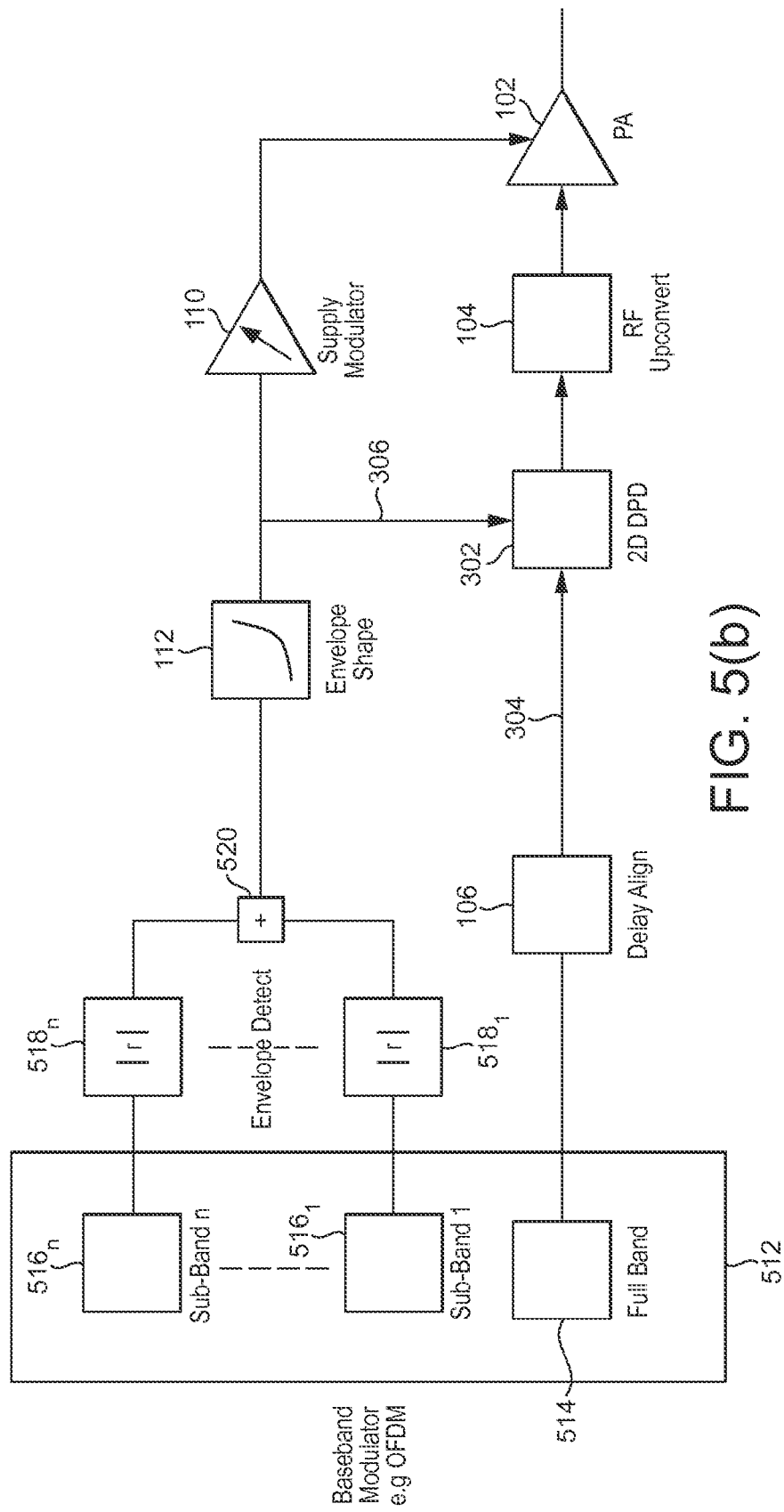

FIG. 5(b) illustrates an implementation in which hardware can be shared in this way.

FIG. 5(b) illustrates an alternative implementation, in which the input signal for the envelope path is generated directly from the baseband. Again, like reference numerals are used in FIG. 5(b) to identify elements which correspond to elements of earlier Figures.

As illustrated in FIG. 5(b), the source block 108 and delay block 106 are adapted to generate the signal to the two dimensional DPD block 302 on line 304 and to produce sub-band envelop signals. The envelope path obtains a signal directly from the baseband.

The source block 108 of FIG. 5(a) is replaced in FIG. 5(b) by a baseband modulator denoted by reference numeral 512, which may be an orthogonal frequency division multiplexing (OFDM) modulator including multiple sub-band outputs.

The baseband modulator 512 includes a block 514 for generating a continuous full band signal to the delay alignment block 106. In addition the modulator includes blocks $516_1$ to $516_n$ which generate discrete sub-band signals, corresponding to the number of sub-bands the baseband signal is divided into, the composite of which is a signal of contiguous frequency signals.

Each sub-band block $516_1$ to $516_n$ generates a signal to a respective envelope detector $518_1$ to $518_n$. As in the arrangement of FIG. 5(a), the outputs of the envelope detectors $518_1$ to $518_n$ are combined by the combiner 520 to generate a signal for the envelope shaping function 112. Thus, the plurality of envelope detectors detect the envelope of a plurality of contiguous frequency bands of the input signal.

The envelope bandwidth reduction technique described above allows a large reduction in envelope path bandwidth. For example, if four sub-bands are used the envelope bandwidth is reduced to ¼ that of a conventional full bandwidth envelope tracking system. However, the average voltage of the reduced bandwidth supply voltage is higher than that of a full bandwidth system, resulting in less envelope tracking efficiency improvement. It should be noted, however, that useful efficiency enhancement may still be obtained with bandwidth reduction factors of 4 or even 8 for signals using high order carrier modulation (e.g. 256 QAM), exhibiting very high PAPR (peak to average power ratio), such as 802.11ac MCS9.

As noted above, the envelope spectrum of each of the sub-band signals is independent of its carrier frequency. Hence the technique is not restricted to envelope bandwidth reduction for contiguous wideband signals, but can be used to generate a modulated supply for two or more independent frequency separated carriers, such as may be present in LTE (long-term evolution) carrier aggregation.

In the case of independent frequency separated carriers, the resulting supply bandwidth is that of the highest bandwidth carrier irrespective of the carrier separation.

Figure 6A:
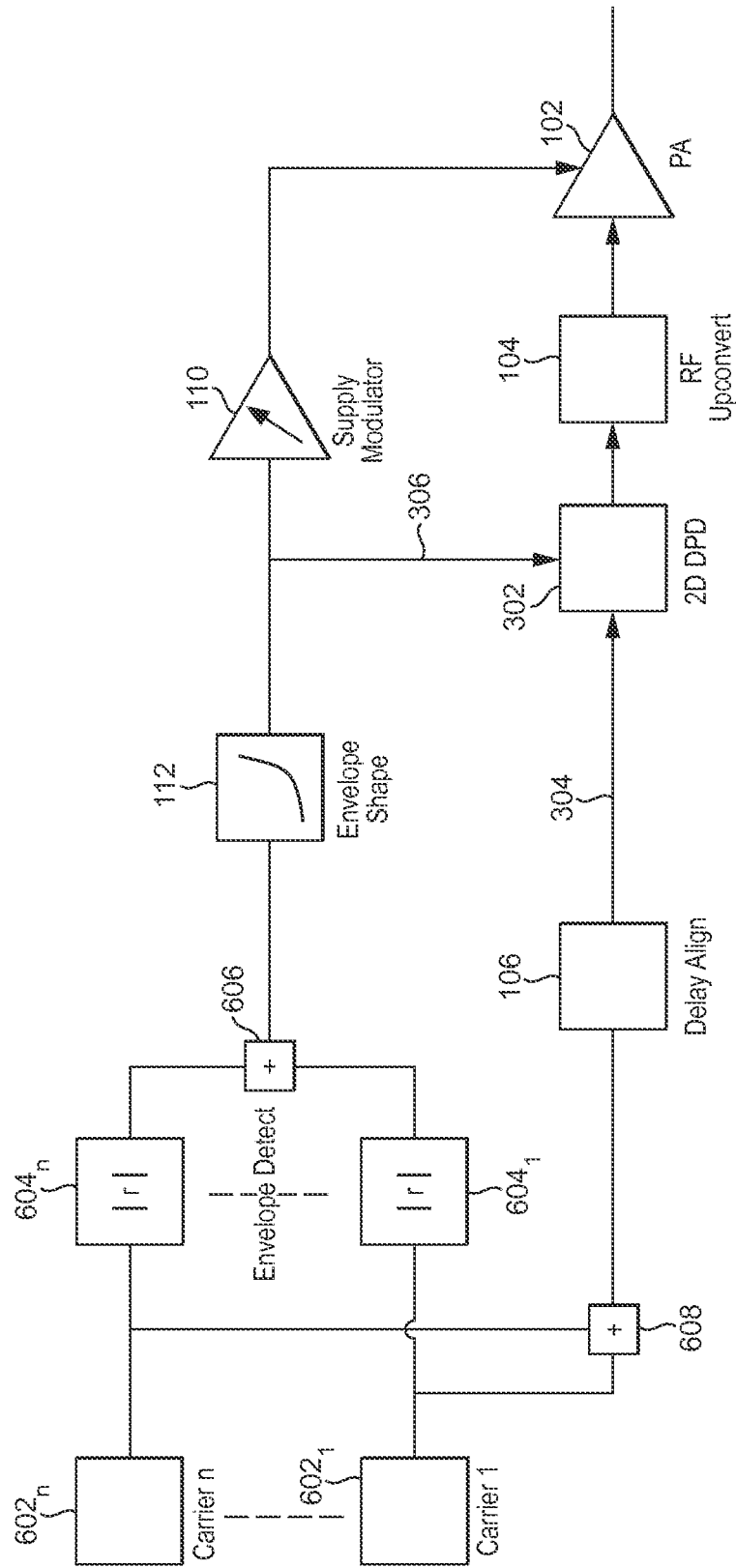
FIGS. 6(a) and 6(b) illustrate circuitry in the envelope path to generate a signal of reduced bandwidth in dependence upon the carrier signals being generated separately.
Figure 6B:
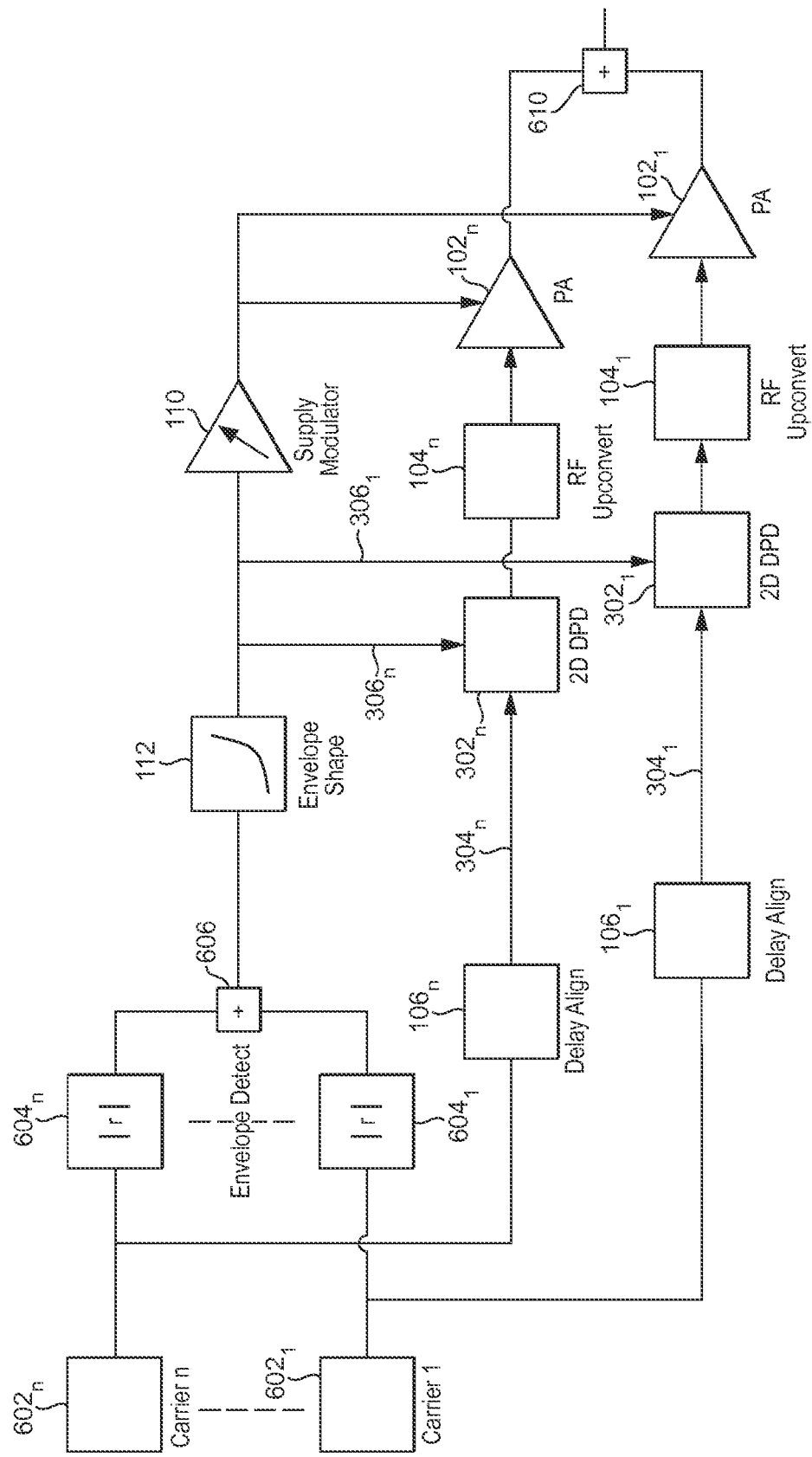

FIGS. 6(a) and 6(b) illustrate exemplary implementations of the foregoing techniques applied to an envelope tracking power amplifier system in which independent frequency separated carriers are utilized, rather than a composite signal of contiguous frequency bands. As above, reference numerals are used in the Figures to refer to elements which correspond to elements shown in earlier Figures.

With reference to FIG. 6(a), as in the arrangement of FIG. 5(b) the delay block 106 receives one input which is the signal to be amplified. The envelope path directly receives an envelope signal.

More particularly discrete independent carrier signals are generated by discrete independent carrier signal generation blocks denoted by reference numerals $602_1$ to $602_n$. It is assumed in this example that n carrier signals may be generated. The output of each carrier generation block $602_1$ to $602_n$ is provided to a combiner 608, which generates on its output a combined signal to the delay block 106.

In addition the output of each discrete carrier generation block $602_1$ to $602_n$ is input to a respective envelope detection block $604_1$ to $604_n$. As in foregoing arrangements, such as the arrangement of FIG. 5(b), the output of each envelope detection block $604_1$ to $604_n$ is combined by a combiner 606, which generates a combined output signal to the envelope shaping function 112.

The arrangement of FIG. 6(a) provides a system architecture in which a single wideband power amplifier is used to amplify the independent carriers. For such an architecture the bandwidth of the two dimensional DPD block 302 must be sufficiently high to accommodate all the carrier frequencies. Hence the architecture as illustrated in FIG. 6(a) is best suited to intra-band carrier aggregation where the carrier separation between the independent carrier frequencies is relatively small.

FIG. 6(b) illustrates an alternative implementation, in which multiple power amplifiers are used rather than a single power amplifier. A single envelope path for the multiple power amplifiers is used in combination with multiple RF input paths.

As with previous Figures, elements shown in FIG. 6(b) are denoted by reference numerals corresponding to earlier Figures if the elements provide similar functionality.

In FIG. 6(b) there are provided n power amplifiers, representative of an example of multiple power amplifiers being provided. The RF input paths, whilst being multiple RF input paths, correspond in their functionality to the input paths of foregoing Figures, and thus the DPD block, the RF up-conversion block and the power amplifier are denoted by subscripts. Thus a first RF input path comprises a DPD block $302_1$, and an RF up-conversion block $104_1$, and a power amplifier $102_1$. A further RF input path, denoted to be the nth RF input path, comprises a DPD block $302_n$, an RF up-conversion block $104_n$, and a power amplifier $102_n$. The outputs of the power amplifiers $102_1$ to $102_n$ are combined in a combiner 610 to provide a single output signal.

The carrier provided by the carrier generation block $602_1$ provides an input signal to a delay alignment block $106_1$, which provides an input to the DPD block $302_1$. An nth carrier generation block $602_n$ provides an input to a delay alignment block $106_n$, which provides an input to the DPD block $302_n$.

As in the arrangement of FIG. 6(a), the carrier generation block $602_1$ to $602_n$ generate inputs to respective envelope detection blocks $604_1$ to $604_n$, which are combined in the combiner 606 to provide an input to the envelope shaping function 112.

Thus FIG. 6(b) illustrates an architecture in which a single modulator is used to provide a single modulated supply to two simultaneously active power amplifiers, which may have large carrier frequency separation. The DPD bandwidth requirement for this variant is no greater than that required for a conventional one dimensional DPD solution.

The envelope tracking system described herein may be utilized in a number of different applications. For example the envelope tracking system may be implemented in a cellular system or a WiFi system, such as in a wireless handset or infrastructure element of a wireless system.

The present invention has been described by way of example to its implementation in various exemplary systems. One skilled in the art will understand that the invention may be provided in systems other than those systems which are illustrated.

What is claimed is:

1. An envelope tracking power amplifier system comprising an RF path and an envelope path, the envelope path comprising:
    a plurality of envelope detectors for detecting the envelope of a plurality of frequency bands of an input signal and each generating an output signal; and
    a combiner for combining the output of the envelope detectors.

2. The envelope tracking power amplifier system of claim 1, wherein the plurality of frequency bands are contiguous frequency bands.

3. The envelope tracking power amplifier system of claim 1, wherein the envelope path further comprises a corresponding plurality of filters each adapted to receive the input signal and for generating inputs to the envelope detectors of a specific frequency band.

4. The envelope tracking power amplifier system of claim 1, wherein each envelope detector is adapted to receive an input signal of a specific frequency band.

5. The envelope tracking power amplifier system of claim 1, wherein the input signal provides an input to an RF amplifier, and further comprising envelope processing circuitry, including an envelope shaping block, for providing an input to a modulator providing a modulated power supply to the RF amplifier based on the combined output of the envelope detectors.

6. The envelope tracking power amplifier system of claim 1, further comprising a digital pre-distortion block provided in the input path and arranged to receive a signal representative of a power amplifier input and a signal representative of the power amplifier supply voltage and to provide an input to the power amplifier.

7. The envelope tracking power amplifier of claim 1, further comprising:
    envelope processing circuitry for providing an input to a modulator providing a modulated power supply to the RF amplifier based on the combined output of the envelope detectors.

8. The envelope tracking power amplifier system of claim 7, wherein the envelope processing circuitry includes an envelope shaping block and in which the digital pre-distortion entity receives a shaped composite envelope signal and the input signal.

9. The envelope tracking power amplifier system of claim 1, further comprising:
    a plurality of input paths each for receiving an input signal of a particular frequency; and
    a combiner for combining the signals on the inputs paths and for providing the combined input signals to the digital pre-distortion block.

10. The envelope tracking power amplifier system of claim 9, further comprising a delay block, for applying a delay to the signal in the input path, and for aligning the power amplifier supply voltage and the power amplifier input voltage.

11. The envelope tracking power amplifier system of claim 1, further comprising:
    a plurality of input paths each for receiving an input signal of a particular frequency;
    a plurality of digital pre-distortion blocks arranged to receive a signal representative of a power amplifier input in the respective input path and the signal representative of the power amplifier supply voltage; and
    a plurality of power amplifiers each for receiving an input signal in the respective input path;
    wherein the power supply for each of the plurality of power amplifiers is provided in dependence on the composite envelope signal.

12. The envelope tracking power amplifier system of claim 11, further comprising a delay block in each of the plurality of input paths for aligning the power amplifier supply voltage and the respective power amplifier input voltage in each input path.

13. A method for signal amplification via an envelope tracking power amplifier system comprising an RF path and an envelope path, the method comprising:
    detecting the envelope of a plurality of contiguous frequency bands of an input signal in a plurality of envelope detectors, each generating an output signal; and
    combining the output of the envelope detectors.

14. The method claim 13, wherein the envelope path further comprises a corresponding plurality of filters each adapted to receive the input signal and the method further comprises generating inputs to the envelope detectors of a specific frequency band, each envelope detector receiving an input signal of a specific frequency band.

15. The method of claim 13, further comprising applying digital pre-distortion in the input path, arranged to receive a signal representative of a power amplifier input and a signal representative of the power amplifier supply voltage, and adapting the digital pre-distortion to provide an input to the power amplifier.

16. The method of claim 13, further comprising applying a delay to the signal in the input path and aligning the power amplifier supply voltage and the power amplifier input voltage.

17. A method for signal amplification via an envelope tracking power amplifier system comprising an RF input path and an envelope path for providing a modulated power amplifier supply, the method comprising:
  detecting the envelope of a plurality of frequency bands of an input signal in a plurality of envelope detectors, each generating an output signal; and
  combining the output of the envelope detectors to provide a composite envelope signal.

18. The method of claim 17, further comprising:
  digitally pre-distorting a signal by receiving a signal representative of a power amplifier input and a signal representative of the power amplifier supply voltage, wherein the digital pre-distortion is applied in the input path and provides an input to the power amplifier, the method further comprising providing an input to a modulator providing a modulated power supply to the RF amplifier based on the composite envelope signal, further comprising envelope shaping, the digital pre-distortion entity receiving a shaped composite envelope signal and the input signal.

19. The method of claim 17, further comprising:
  receiving in a plurality of input paths each for an input signal of a particular frequency; and
  combining the signals on the inputs paths and for providing the combined input signals to the digital pre-distortion block.

20. The method of claim 17, further comprising:
  receiving an input signal of a particular frequency in a plurality of input paths;
  digitally pre-distorting a signal representative of a power amplifier input in the respective input path and the signal representative of the power amplifier supply voltage; and
  a plurality of power amplifiers each for receiving an input signal in the respective input path;
  wherein the power supply for each of the plurality of power amplifiers is provided in dependence on the composite envelope signal.

* * * * *